United States Patent
Sheng et al.

(10) Patent No.: US 6,995,381 B2
(45) Date of Patent: Feb. 7, 2006

(54) SYSTEM AND METHOD FOR MULTI-WAFER SCANNING IN ION IMPLANTERS

(75) Inventors: Alan P. Sheng, Gloucester, MA (US); Benjamin B. Riordon, Newburyport, MA (US); Lawrence M. Ficarra, Billerica, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 10/730,863

(22) Filed: Dec. 8, 2003

(65) Prior Publication Data

US 2005/0121626 A1    Jun. 9, 2005

(51) Int. Cl.
  *H01J 37/317* (2006.01)
(52) U.S. Cl. ................................. 250/492.21
(58) Field of Classification Search ........... 250/492.21, 250/442.11, 398, 492
  See application file for complete search history.

(56) References Cited

U.S. PATENT DOCUMENTS 4,346,301 A * 8/1982 Robinson et al. ........ 250/492.2
4,633,138 A * 12/1986 Tokiguchi et al. ....... 250/492.2
6,608,316 B1 * 8/2003 Harrison ................. 250/492.21

* cited by examiner

Primary Examiner—Jack I. Berman

(57) ABSTRACT

Methods and systems are provided for increasing the efficiency of the ion beam during scanning workpieces in ion implanting such that multiple wafers are arranged on a platen or support so that a greater portion of the beam scans the workpiece surface. Specifically, an apparatus is provided for ion implanting a plurality of workpieces. The apparatus includes an ion source for generating an ion beam having a scan width and a scan distance which defines a predetermined scan area, a holder for receiving the workpieces that are arranged so as to maximize the surface area of the workpieces present within the predetermined scan area. Thereby, a scanner may scan the ion beam over the predetermined scan area so that the utilization efficiency of said ion beam on the workpieces is increased. More particularly, the workpieces may be semiconductor wafers that are arranged over the holder or a platen according to the formula:

$$d_s = \sqrt{D_w^2 - (w_s - D_w)^2} * (Q_w - 1) + D_w + OS$$

As a result of arranging the workpieces on the holder in this manner, the utilization of ion beam is maximized.

20 Claims, 5 Drawing Sheets

SYSTEM AND METHOD FOR MULTI-WAFER SCANNING IN ION IMPLANTERS

BACKGROUND (1) Field

The disclosed systems and methods relate generally to ion beam scanning of workpieces and in particular to semiconductor wafers. Specifically, the systems and methods are directed to linearly scanning multiple wafers during a single pass of an ion beam scanning so that the ion beam is more efficiently utilized and the throughput of the wafers is increased.

(2) Description of Relevant Art

Ion implantation is a standard technique for introducing conductivity-altering impurities into semiconductor wafers. A desired impurity is ionized in an ion source, the ions ale accelerated to form an ion beam of prescribed energy, and the ion beam is directed at the surface of the wafer. The energetic ions in the beam penetrate into the bulk of the semiconductor material and are embedded into the crystalline lattice of the semiconductor material to form a region of desired conductivity.

Ion implantation systems usually include an ion source for converting a (as or a solid material into a well-defined ion beam. The ion beam is mass analyzed to eliminate undesired ion species, is accelerated to a desired energy and is directed onto a target plane. Various ion implanting systems are known. In one such conventional ion implanter, an ion beam is used that is much smaller than the wafer in both the vertical and horizontal directions. This implanter distributes the implant dose across the wafer by scanning the beam, moving the wafer or a combination of beam scanning and wafer movement. However, in these systems, the ion beam is not directed onto the wafer for the entire scan time and the efficiency of the beam scan suffers. It is desired to maximize the efficiency of the ion beam by directing the beam onto the wafer or the largest amount of scan time as possible.

In another type of known ion implanter, a fixed width ion beam is utilized that is greater than the diameter of the wafer and is only scanned vertically. In contrast, the ion beam is scanned both horizontally and vertically if a small sized spot beam is used for implantations. In one example of a fixed width ion beam, a ribbon ion beam is selected so that the width of the ion beam is slightly larger than the diameter of the wafer and the beam is vertically scanned across the wafer. Presently, wafer diameter sizes of 200 mm and 300 mm and flat panel displays exceeding 300 mm are commonly used with larger sizes expected. In these cases, the fixed beam width must be chosen to be greater than the largest expected workpiece size.

However, a great inefficiency of the beam results when a smaller workpiece than the maximized design width of the ion beam size is used. For instance, a fixed beam width of 300 mm may be used to meet the present standard for 300 mm wafers as shown in FIG. 2(a) and a fixed beam width of 200 mm is used for systems where the maximum workpiece size is 200 mm or less. The beam width $w_b$ of the 300 mm beam is designed to be slightly larger than the 300 mm wafer, for instance a fixed beam width of approximately 330 mm may be used with a scan distance $d_s$ of approximately 380 mm. Similarly, the beam width $w_b$ of the 200 mm beam is designed to be approximately 230 mm and has a scan distance $d_s$ of approximately 280 mm. However, when a 200 mm (or smaller) wafer is implanted with a fixed beam width of 300 mm, the beam is inefficiently used as shown in FIG. 2(c). Whenever a wafer is used that is smaller than the designed size for the ion beam, an inefficiency in use of the beam will result.

In another type of a conventional ion implanter, a variable width beam is utilized to approximate the shape of the wafer. Width sensors are used to detect the width of the wafer and the speed of the wafer movement is controlled to compensate for dose variations which result from different sweep widths. Also, it is known to match the width of the target wafer with the width of the scan beam by varying the sequence of scan times. Such systems require complex detection and processing devices. Furthermore, variable width beam systems may not be used in many systems due to limitations and constraints on the electronics and architecture of such implanting systems.

Accordingly, an ion implanter that increases the efficiency of the fixed width beam while scanning workpieces for applications such as ion implanting.

SUMMARY

The disclosed methods and systems are directed to increasing the efficiency of the ion beam during scanning workpieces for ion implanting. More particularly,. multiple wafers are arranged on a platen or support so that a greater portion of the beam scans the workpiece surface. In one embodiment of the present invention, an apparatus is provided for ion implanting a plurality of workpieces. The apparatus includes an ion source for generating an ion beam having a scan width and a scan distance which defines a predetermined scan area, a holder for receiving the workpieces that are arranged so as to maximize the surface area of the workpieces present within the predetermined scan area. Thereby, a scanner may scan the ion beam over the predetermined scan area so that the utilization efficiency of said ion beam on the workpieces is increased. More particularly, the workpieces may be semiconductor wafers that are arranged over the holder or a platen according to the formula:

$$d_s = \sqrt{D_w^2 - (w_s - D_w)^2} * (Q_w - 1) + D_w + OS$$

where $d_s$=said scan distance, $D_w$=the diameter of said wafers, $w_s$=said scan width, $Q_w$=quantities of said wafers/holder, and OS=a standard overscan of said ion bean. As a result of arranging the workpieces in this manner, the utilization of ion beam is maximized.

In another embodiment of the present invention, a method is provided for ion implanting a plurality of workpieces. The method includes the steps of generating an ion beam having a scan width and a scan distance which defines a predetermined scan area and arranging, the wafers on a holder so as to maximize the surface area of the workpieces present within the predetermined scan area. Thereby, the method may scan the ion beam over the predetermined scan area so that the utilization efficiency of the ion beam on the wafers is increased.

Other objects and advantages will become apparent hereinafter in view of the specification and drawings.

DESCRIPTION

To provide an overall understanding, certain illustrative embodiments will now be described; however, it will be understood by one of ordinary skill in the art that the systems and methods described herein can be adapted and modified to provide systems and methods for other suitable applications and that other additions and modifications can be made without departing from the scope of the systems and methods described herein.

Unless otherwise specified, the illustrated embodiments can be understood as providing, exemplary features of varying detail of certain embodiments, and therefore features, components, modules, and/or aspects of the illustrations or processes can be otherwise combined, separated, interchanged, and/or rearranged without departing from the disclosed systems or methods.

Figure 1:
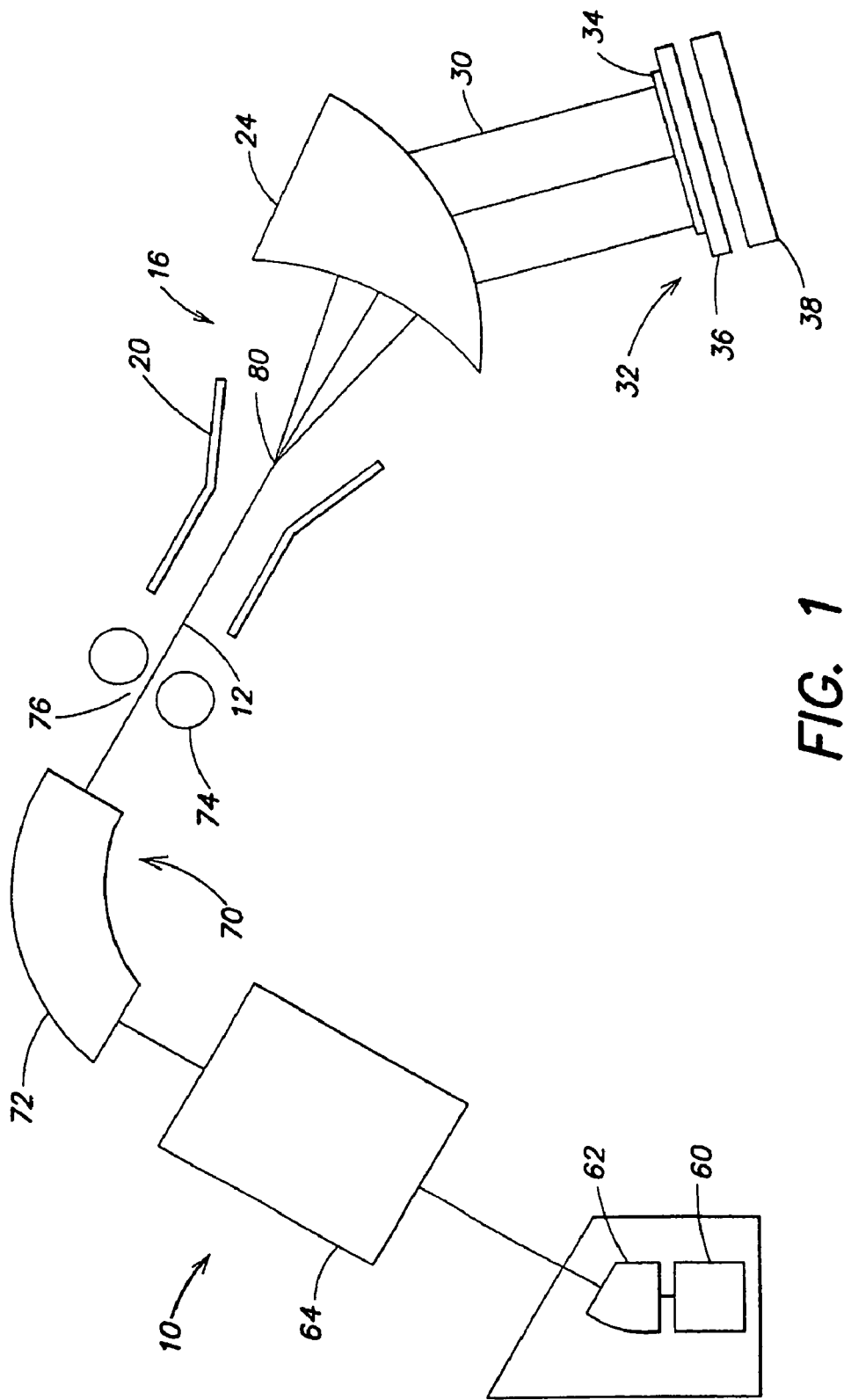
FIG. 1 is a block diagram of an implanting system according to an embodiment of the present invention.

A simplified block diagram in FIG. 1 shows one example of an ion implanter suitable for incorporating an embodiment of the present invention. An ion beam generator 10 generates an ion beam of a desired species, accelerates ions in the ion beam to desired energies, performs mass/energy analysis of the ion beam to remove energy and mass contaminants and supplies an energetic ion beam 12 having a low level of energy and mass contaminants. A scanning system 16, which includes a scanner 20, an angle corrector 24 and a scan generator 26, deflects the ion beam 12 to produce a scanned ion beam having parallel or nearly parallel ion trajectories.

An end station 32 includes a platen 36 that supports a semiconductor wafer 34 or other workpiece in the path of scanned ion beam 30 such that ions of the desired species are implanted into the semiconductor wafer 34. End station 32 may include a Faraday cup 38 for monitoring ion beam dose and dose uniformity.

The ion beam generator 10 includes an ion beam source 60, a source filter 62, an acceleration/deceleration column 64 and a mass analyzer 70. The source filter 62 is preferably positioned in close proximity to ion beam source 60. The acceleration/deceleration column 64 is positioned between source filter 62 and mass analyzer 70. The mass analyzer 70 includes a dipole analyzing magnet 72 and a mask 74 having a resolving aperture 76.

The scanner 20, which may be an electrostatic scanner, defects ion beam 12 to produce a scanned ion beam having ion trajectories which diverge from a scan origin 80. The scanner 20 may comprise spaced-apart scan plates connected to scan generator 26. The scan generator 26 applies a scan voltage waveform, such as a triangular waveform, for scanning the ion beam in accordance with the electric field between the scan plates. The ion beam is typically scanned in a horizontal plane.

Angle corrector 24 is designed to deflect ions in the scanned ion beam to produce scanned ion beam having parallel ion trajectories, thus focusing the scanned ion beam. In particular, the angle corrector 24 may comprise magnetic polepieces which are spaced-apart to define a gap and a magnet coil which is coupled to a power supply (not shown).

The scanned ion beam passes through the gap between the polepieces and is deflected in accordance with the magnetic field in the gap. The magnetic field may be adjusted by varying the current through the magnet coil.

In operation, scanning system 16 scans ion beam 12 across wafer 34 in a horizontal direction, and mechanical translation system 40 translates platen 36 and wafer 34 vertically with respect to scanned ion beam 30. A combination of electronic scanning of ion beam 12 and mechanical translation of wafer 34 causes the ion beam to be distributed over the surface of wafer 34. The ion beam current is measured by Faraday clip 38 when platen 36 is in a lowered position, and a signal representative of ion beam current is supplied to a system controller (not shown). The electronic scan speed can be varied as a function of horizontal beam position to achieve dose uniformity.

Figure 2A:
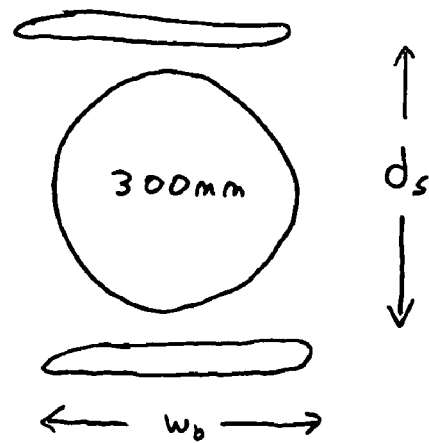
FIGS. 2(a), 2(b), and 2(c) are examples of ion beam scanning of workpieces in an ion implanting system.
Figure 2B:
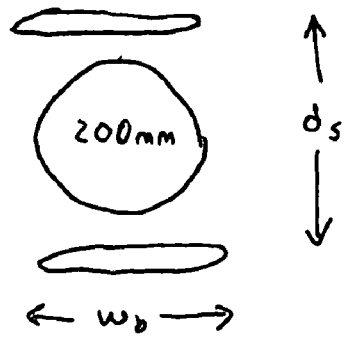
Figure 2C:
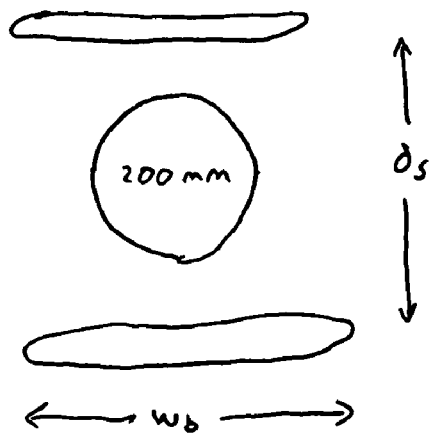
Figure 3A:
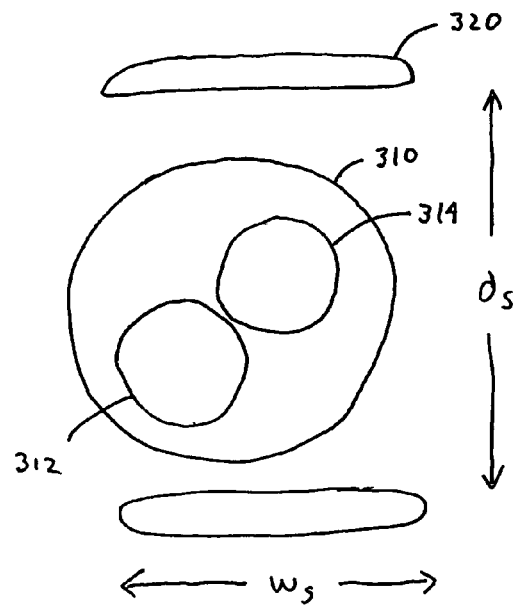
FIGS. 3(*a*) and 3(*b*) are examples of workpiece configurations on platens according to embodiments of the present invention.

The present invention is directed to increasing the utilization of the ion beam when the ion beam scan workpieces that are smaller than the maximum design width of the ion beam. As described above with reference to FIG. 2(*c*), a large portion of the 300 mm ion beam does not scan the 200 mm wafer. In an embodiment of the present invention, two wafers are arranged to utilize the ribbon beam more efficiently. In the present embodiment, two 200 mm wafers 312 and 314 are arranged on a platen 310 that is scanned by a 300 mm ribbon beam 320. The platen 310 is sized to hold the wafers 312 and 314 that are arranged as shown in FIG. 3(*a*). This arrangement presents more wafer surface area within a scan area of the beam. An optimal arrangement for the positions of the two wafers is determined according to the following general formula:

$$d_s = \sqrt{D_w^2 - (w_s - D_w)^2} * (Q_w - 1) + D_w + OS \qquad \text{Eqn. (1)}$$

where $d_s$=said scan distance, $D_w$=the diameter of said wafers, $w_s$=said scan width, $Q_w$=quantities of said wafers/holder, and $OS$=a standard overscan of said ion beam

TABLE 1

| | |
|---|---|
| Wafer Diameter | 200 mm |
| Platen Wafer Quantity | 2 |
| Horizontal Scan Width | 300 mm |
| Calculated Vertical Height | 373 mm |
| Standard Overscan | 80 mm |
| Total Overscan | 453 mm |
| Scan Area | 135962 mm² |
| Increase Scan Time | 1.62 |
| Number of Wafers | 2 |
| Increased Throughput | 24% |

By more efficiently utilizing the ribbon beam 320, the throughput for implanted wafers 312 and 314 can be significantly increased. More specifically, in the arrangement of wafers 312 and 314 as described in the above embodiment, the throughput is increased by about 24%. Even though the scan distance and the scan time, which is directly proportional to the scan distance, are increased, the wafer throughput is increased because a greater amount of the ribbon beam is used to scan the wafers. For a single 200 mm wafer that is conventionally scanned by a 300 mm ribbon beam as shown in FIG. 2(*c*), a scan distance of approximately 280 mm is required. However, when wafers 312 and 314 are arranged as shown in FIG. 3(*a*), a scan distance of approximately 453 mm is required. This increase in the scan distance (scan time) of 1.62×(453/280) increases the wafer throughput by 2/1.62=1.24 for a 24% increase because the ribbon beam 320 scans two wafers instead of one wafer.

Similar calculations may be performed by one skilled in the art to maximize the beam on wafer efficiency whenever a smaller wafer than the wafer size that is designed for the beam to realize an increase in the wafer throughput. It is appreciated that the efficient beam utilization of the beam is not limited to the specific example described in the above embodiment for the 300 mm beam and the 200 mm wafers. The present invention may be implemented for any case where the wafer to be scanned is less than the maximum design width of the ribbon beam.

Figure 3B:
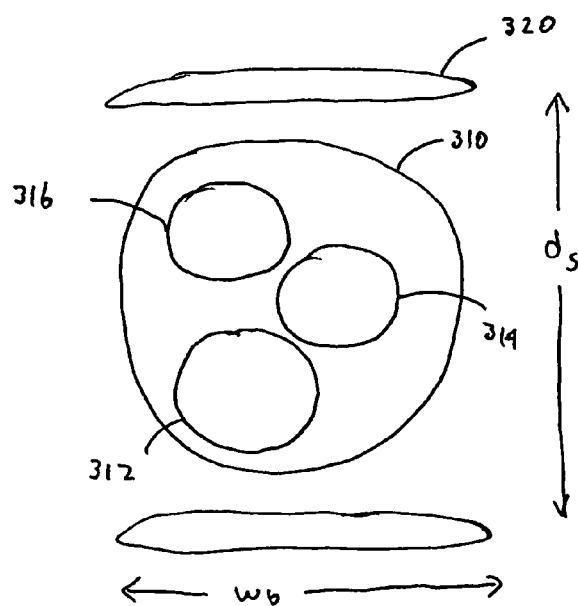

In further embodiments of the present invention, three or more wafers or workpieces may be arranged to more efficiently utilize the ribbon beam. In FIG. 3(c), three 200 mm wafers 312, 314 and 316 are arranged on a platen 311 that is scanned by a 300 mm ribbon beam 320. The platen 311 is sized to hold the wafers 312, 314 and 316 that are arranged as shown in FIG. 3(b). An optimal arrangement for the positions of the three wafers is determined by using Eqn. (1) as described above for the case of two wafers.

By more efficiently utilizing the ribbon beam 320, the throughput for implanted wafers 312, 314 and 316 can be significantly increased. More specifically, in the arrangement of wafers 312, 314 and 316 as described in the above embodiments the throughput is increased by about 34%. When wafers 312, 314 and 316 are arranged as shown in FIG. 3(b), a scan distance of approximately 626 mm is required as compared to a scan distance of 280 mm when a single 200 mm wafer is scanned. This increase in the scan distance (scan time) of 2.24× (628/280) increases the wafer throughput by 3/2.24=1.34 for a 34% increase because the ribbon beam 320 scans three wafers instead of one wafer.

Table 2 below shows the calculations for this three wafer example.

TABLE 2

| | |
|---|---|
| Wafer Diameter | 200 mm |
| Platen Wafer Quantity | 3 |
| Horizontal Scan Width | 300 mm |
| Calculated Vertical Height | 546 mm |
| Standard Overscan | 80 mm |
| Total Overscan | 626 mm |
| Scan Area | 187923 mm² |
| Increase Scan Time | 2.24 |
| Number of Wafers | 3 |
| Increased Throughput | 34% |

These calculations may be performed by one skilled in the art to maximize the beam on wafer efficiency if an arrangement of four or more wafers as in the case above for three wafers. Also, these calculations can be performed for an arrangement of any wafer size whenever a smaller wafer than the size that is designed for the beam to realize an increase in the wafer throughput. It is appreciated that the efficient beam utilization of the beam is not limited to the specific example described in the above embodiment for the 300 mm beam and the three 200 mm wafers. The present invention may be implemented for any case where two or more wafers to be scanned are less than the maximum design width of the beam.

Figure 4A:
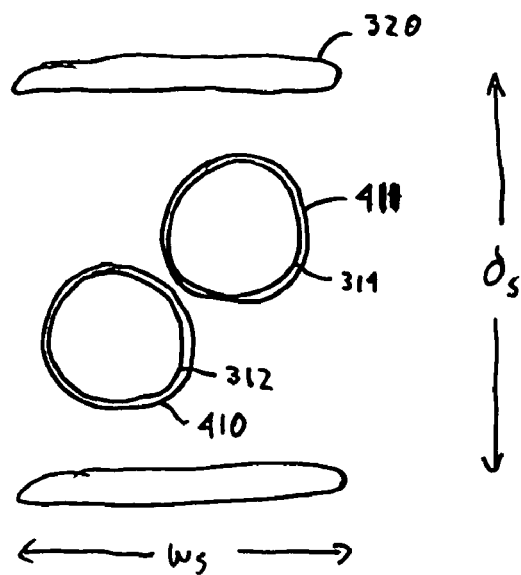
FIGS. 4(*a*) and 4(*b*) are examples of workpiece configurations on platens according to other embodiments of the present invention.
Figure 4B:
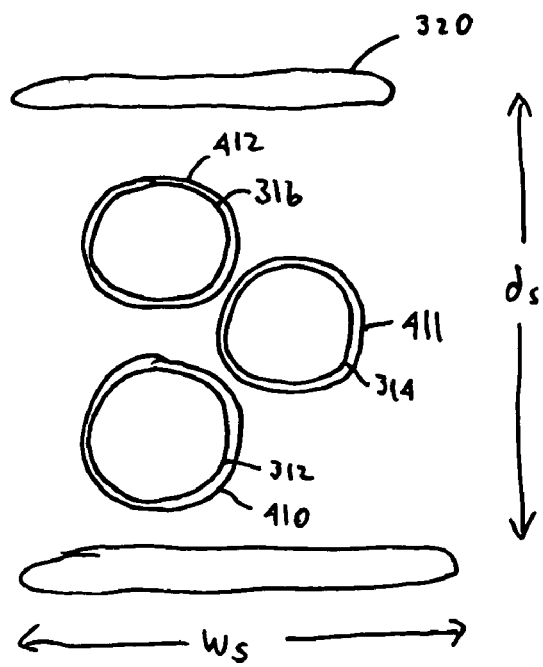
Figure 5:
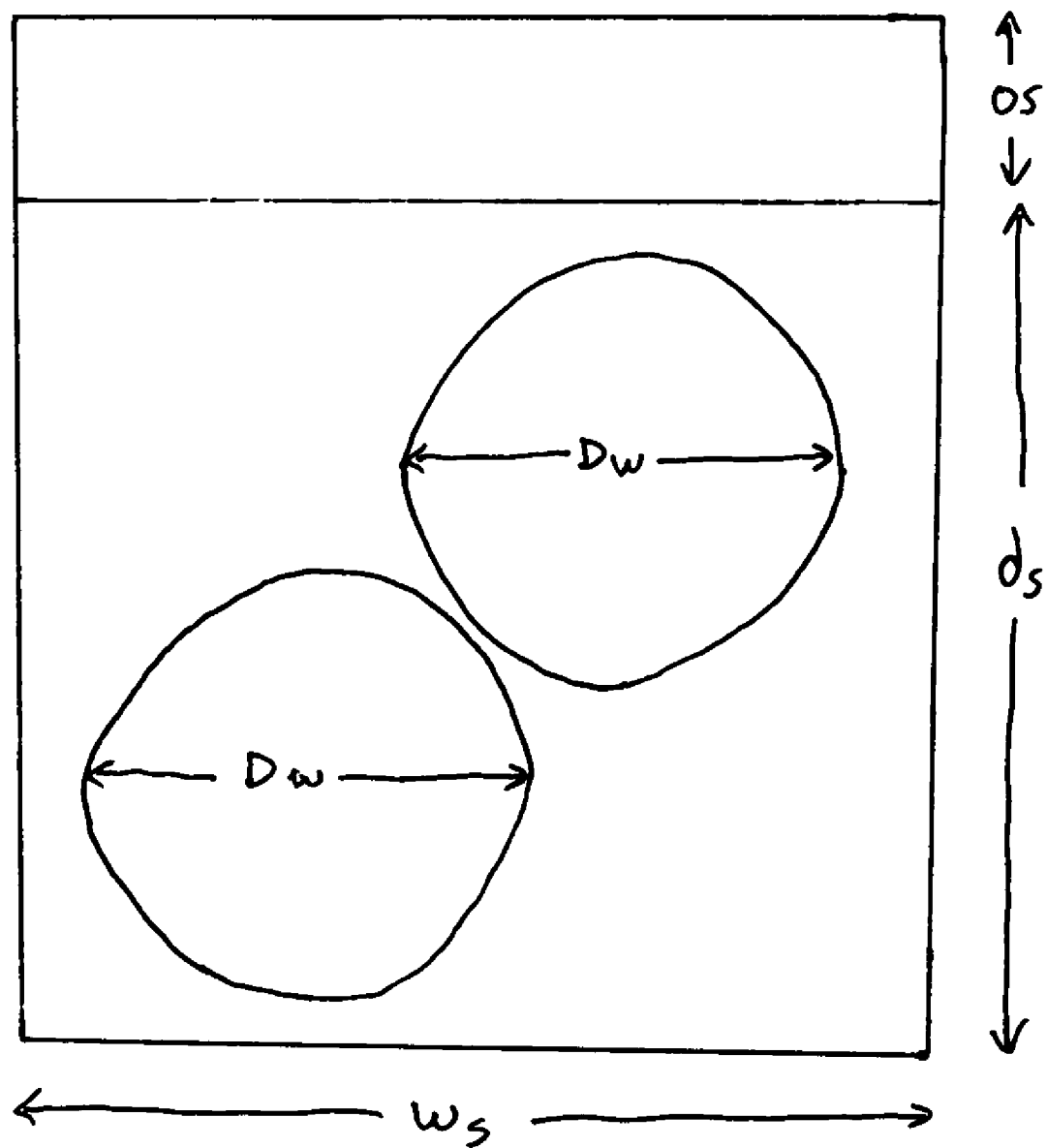
FIG. 5 illustrates a specific arrangement of two wafers according to an embodiment of the present invention.

In other embodiments of the present invention, multiple platens or supports may be used to hold the workpieces as illustrated in FIGS. 4(a) and 4(b). In the previous embodiments, a single platen was used that was sufficiently large enough to hold the desired number of workpieces. However, it may be advantageous to use multiple separate platens where each platen is dedicated to hold each of the one workpiece. FIG. 4(a) illustrates two platens 410 and 411 for holding wafers 312 and 314 and FIG. 4(b) illustrates three platens 412, 413, and 414 for holding wafers 312, 314, and 316. Each of these platens is arranged according as described in the above embodiments so that the wafers are positioned to maximize the utilization of the beams. In configurations having more than three wafers, it is realized that a corresponding number of platens is used to each wafer or workpiece. However, in still other embodiments, platens of various sizes may be used to hold two or more wafers so that the wafers and platens do not correspond to each other.

Although the methods and systems have been described relative to a specific embodiment thereof, they are not so limited. Obviously many modifications and variations may become apparent in light of the above teachings.

Many additional changes in the details, materials, and arrangement of parts, herein described and illustrated, can be made by those skilled in the art. Accordingly, it will be understood that the following claims are not to be limited to the embodiments disclosed herein, can include practices otherwise than specifically described, and are to be interpreted as broadly as allowed under the law.

What is claimed is:

1. An apparatus for ion implanting a plurality of workpieces, comprising:
   an ion source for generating an ion beam having a scan width and a scan distance which defines a predetermined scan area;
   a holder for receiving said workpieces that are arranged so as to maximize the surface area of said workpieces present within said predetermined scan area; and
   a scanner for scanning said ion beam over said predetermined scan area for maximizing the utilization efficiency of said ion beam on said workpieces by scanning the plurality of workpieces within said predetermined scan area.

2. An apparatus according to claim 1 wherein said workpieces are semiconductor wafers.

3. An apparatus according to claim 2 wherein said ion beam is a ribbon beam.

4. An apparatus according to claim 3 wherein said ribbon beam has a 300 mm scan width and the diameter of said wafers is 200 mm.

5. An apparatus according to claim 2 wherein said holder comprises a platen sufficiently sized for receiving said semiconductor wafers.

6. An apparatus according to claim 2 wherein said holder comprises a plurality of platens arranged within said predetermined scan area.

7. An apparatus according to claim 6 wherein said plurality of platens corresponds to the number of said wafers.

8. An apparatus according to claim 6 wherein the number of said platens is less than the number of said wafers.

9. An apparatus according to claim 2 wherein said scan distance of said ion beam is varied depending upon the number of said wafers.

10. An apparatus according to claim 9 wherein said scan distance is varied by a formula:

$$d_s = \sqrt{D_2^{\prime\prime} - (w_s - D_w)^2} * (Q_w - 1) + D_w + OS$$

where $d_s$=said scan distance, $D_w$=the diameter of said wafers, $w_s$=said scan width, $Q_w$=quantities of said wafers/holder, and $OS$=a standard overscan of said ion beam.

11. A holder for receiving a plurality of workpieces, comprising:
   a scan area for receiving said workpieces;
   wherein said scan area is defined by a scan width and a scan distance that is sufficient for arranging said workpieces thereon so as to maximize the surface area of said workpieces present within said scan area.

12. A holder according to claim 11 wherein said workpieces comprise semiconductor wafers.

13. A holder according to claim 12 further comprising a platen for receiving said workpieces.

14. A holder according to claim 11 further comprising a plurality of platens arranged within said scan area.

15. A holder according to claim 12 wherein said scan distance is varied depending upon the number of said workpieces and said scan width remains constant and the holder is used for implanting said workpieces by an ion beam.

16. A holder according to claim 15 wherein said scan distance is varied by a formula:

$$d_s = \sqrt{D_2^w - (w_s - D_w)^2} * (Q_w - 1) + D_w + OS$$

where $d_s$=said scan distance, $D_w$=the diameter of said wafers, $w_s$=said scan width, $Q_w$=quantities of said wafers/holder, and OS=a standard overscan of said ion beam.

17. A method for ion implanting a plurality of workpieces, comprising the steps of:
   generating an ion beam having a scan width and a scan distance which defines a predetermined scan area;
   arranging said plurality of workpieces on a holder so as to maximize the surface area of said workpieces within said predetermined scan area; and
   scanning said ion beam over said predetermined scan area for maximizing the utilization efficiency of said ion beam on said workpieces by scanning the plurality of workpieces within said predetermined scan area.

18. A method according to claim 17 wherein said workpieces are semiconductor wafers.

19. A method according to claim 17 wherein said scan distance of said ion beam is varied depending upon the number of said workpieces.

20. A method according to claim 19 wherein said holder comprises a plurality of platens arranged within said predetermined scan area.

* * * * *